United States Patent
Matsunaga

(10) Patent No.: US 6,670,710 B2
(45) Date of Patent: Dec. 30, 2003

(54) SEMICONDUCTOR DEVICE HAVING MULTI-LAYERED WIRING

(75) Inventor: Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/917,653

(22) Filed: Jul. 31, 2001

(65) Prior Publication Data

US 2002/0175415 A1 Nov. 28, 2002

(30) Foreign Application Priority Data

May 25, 2001 (JP) ........................... 2001-157195

(51) Int. Cl.[7] .............................................. H01L 23/48
(52) U.S. Cl. ................ 257/758; 257/760; 257/776; 257/635; 257/637; 257/639; 257/640; 257/649
(58) Field of Search ................... 257/758, 760, 257/776, 635, 637, 639, 640, 649

(56) References Cited

U.S. PATENT DOCUMENTS

| | | | |
|---|---|---|---|
| 5,103,288 A | * 4/1992 | Sakamoto et al. | 357/71 |
| 5,786,625 A | * 7/1998 | Yamaha | 257/644 |
| 5,872,402 A | * 2/1999 | Hasegawa | 257/758 |
| 6,316,833 B1 | * 11/2001 | Oda | 257/758 |
| 6,344,693 B1 | * 2/2002 | Kawahara et al. | 257/759 |

FOREIGN PATENT DOCUMENTS

JP 2000-332018 11/2000

* cited by examiner

*Primary Examiner*—Nathan J. Flynn
*Assistant Examiner*—Fazli Erdem
(74) *Attorney, Agent, or Firm*—Finnegan, Henderson, Farabow, Garrett & Dunner, L.L.P.

(57) ABSTRACT

A semiconductor device is provided with a first insulating film, a first wiring layer formed in the first insulating film, a second insulating film formed above the first wiring layer and the first insulating film, the second insulating film including a low dielectric constant film, a second wiring layer formed in the second insulating film and coupled to the first wiring layer through a first connection section, and a third insulating film formed above the second wiring layer and the second insulating film and serving as one of an interlayer insulating film and a passivation film, and at least one of the first and third insulating films being one of a film formed mainly of SiON, a film formed mainly of SiN, and a laminated film being the films formed mainly of SiON or SiN respectively.

20 Claims, 8 Drawing Sheets

SEMICONDUCTOR DEVICE HAVING MULTI-LAYERED WIRING

CROSS-REFERENCE TO RELATED APPLICATIONS

This application is based upon and claims the benefit of priority from the prior Japanese Patent Application No. 2001-157195, filed May 25, 2001, the entire contents of which are incorporated herein by reference.

BACKGROUND OF THE INVENTION

1. Field of the Invention

The present invention relates to a semiconductor device having a multi-layered wiring structure.

2. Description of the Related Art

In recent semiconductor technology, an interlayer insulating film must be made of a low dielectric constant film. In general, the low dielectric constant film has a low film density and is permeable to water. Even if a very small amount of water, which has a relative dielectric constant k as large as 80 (a maximum value), is contained in the low dielectric constant film, the dielectric constant of the low dielectric constant film inevitably increases. In order to ensure effective use of the low dielectric constant film, therefore, it is necessary to prevent water or moisture from entering the low dielectric constant film.

FIG. 12 is a plan view showing a semiconductor device according to the first example of the prior art, and FIG. 13 is a sectional view taken along line XIII—XIII in FIG. 12.

As shown in FIGS. 12 and 13, a gate electrode 72 is formed on a semiconductor substrate 71. A BPSG (Boron Phosphorous Silicate Glass) film 73 is formed in such a manner as to cover the gate electrode 72. A contact plug 75 is formed inside the BPSG film 73. A first wiring layer 74 is formed on the BPSG film 73 in such a manner that the first wiring layer 74 is connected to the contact plug 75. A TEOS (Tetra Ethyl Ortho Silicate)-SiO$_2$ film 76 is formed in such a manner as to cover the first wiring layer 74, and this TEOS-SiO$_2$ is overlaid with a second wiring layer 77. The second wiring layer 77 is connected to the first wiring layer 74 by way of a via 78. A passivation film 84, which is made up of a PSG film 79 and an SiN film 80, is formed in such a manner as to cover the second wiring layer 77. A via ring 81, which is made by the first and second wiring layers 74 and 77, the contact plug 75 and the via 78, is formed along the periphery of a chip 70. The via ring 81 is intended to prevent cracks at the time of scribing.

In the structure of the first example of the prior art, the passivation film 84 is not a single-layer film. It is a laminated film made up of the PSG film 79 (or another type of SiO$_2$ film) and the SiN film 80 formed on the PSG film 79. This laminated structure serves to suppress the total stress of the film. The structure of the first example of the prior art raises a problem if an opening is formed in the passivation film 84 to provide a pad window. If such an opening is formed, the PSG film 79 is exposed in the wall surface of the opening. Since the exposed portion of the PSG film 79 undesirably serves as an inlet of moisture, it is hard to prevent the water or moisture from entering the chip.

In the process of forming the contact plug 75 and the wiring layers 74 and 77 by use of an Al material, the via ring 81 serves to prevent water from entering the chip from the side portions of the chip. This advantage cannot be expected if the contact plug 75 is formed of W.

FIG. 14 is a plan view showing a semiconductor device according to the second example of the prior art. FIG. 15A is a sectional view taken along line XVA—XVA in FIG. 14, and FIG. 15B is a sectional view taken along line XVB—XVB in FIG. 14.

As can be seen from FIGS. 14 and 15A, in the case where the contact plug 82 is formed of W, the contact plug 82 easily separate from the semiconductor substrate 71. To prevent the contact plug 82 from separating from the substrate 71, a plug such as the via ring 81 of FIG. 13 is not easy to form. Although columnar contact plugs 82 can be formed instead as shown in FIG. 15B, gaps 83 are inevitably produced between the contact plugs 82. Since the multi-layered wiring structure cannot be completely covered, it is hard to prevent water from entering the chip 70 from the side portions of the chip.

As described above, the prior art is not effective in completely protecting the chip from moisture, which may enter the chip from the top, bottom or side portions thereof. In other words, the prior art does not enable effective utilization of the characteristics of a low dielectric constant film.

BRIEF SUMMARY OF THE INVENTION

A semiconductor device according to one aspect of the invention comprises a first insulating film; a first wiring layer formed in the first insulating film; a second insulating film formed above the first wiring layer and the first insulating film, the second insulating film including a low dielectric constant film; a second wiring layer formed in the second insulating film and coupled to the first wiring layer through a first connection section; and a third insulating film formed above the second wiring layer and the second insulating film and serving as one of an interlayer insulating film and a passivation film, and at least one of the first and third insulating films being one of a film formed mainly of SiON, a film formed mainly of SiN, and a laminated film being the films formed mainly of SiON or SiN respectively.

A semiconductor device according to another aspect of the invention comprises a first insulating film; a first wiring layer formed above the first insulating film; a second insulating film formed above the first wiring layer and the first insulating film, the second insulating film including a low dielectric constant film; a second wiring layer formed in the second insulating film and coupled to the first wiring layer through a first connection section; and a third insulating film formed above the second wiring layer and the second insulating film and serving as one of an interlayer insulating film and a passivation film, and at least one of the first and third insulating films being one of a film formed mainly of SiON, a film formed mainly of SiN, and a laminated film being the films formed mainly of SiON or SiN respectively.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Figure 1:
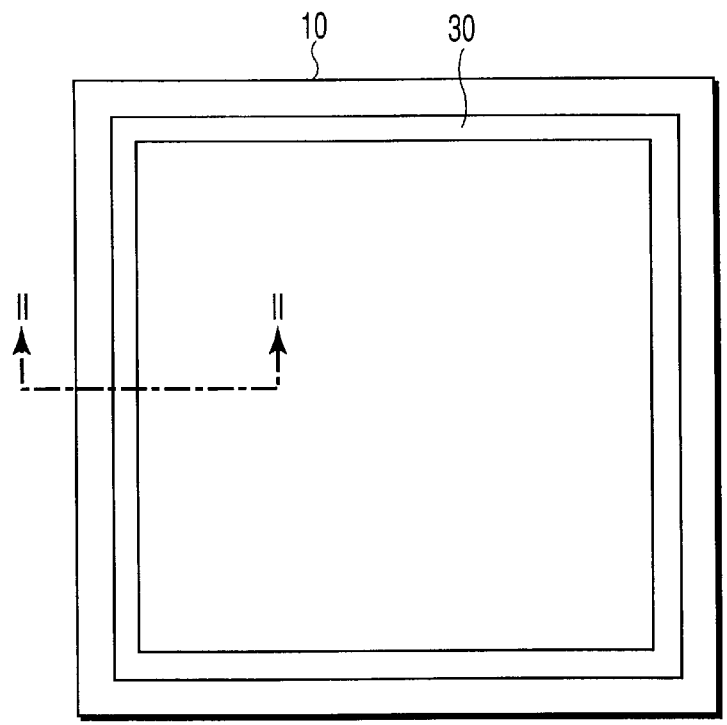
FIG. 1 is a plan view showing a semiconductor device according to one embodiment of the present invention.

The present invention is directed to a multi-layered wiring structure wherein an interlayer insulating film is made of a low dielectric constant film whose specific dielectric constant k is not more than 3. The low dielectric constant film is formed of polymethyl siloxane, hydrogen silsesquioxane, an organic material having a low dielectric constant (e.g. an aromatic hydrocarbon polymer), or the like.

Embodiments of the present invention will now be described with reference to the accompanying drawings. In the descriptions below, the same reference numerals will be used to denote corresponding or similar structural elements.
[First Embodiment]

The first embodiment is featured in that a high-level interlayer insulating film, which is a low dielectric constant film, and the layers between the lowermost wiring layers, are made of a film with low water absorption and water permeability.

The "film with low water absorption and water permeability" used herein is a film that lower than a TEOS (Tetra Ethyl Ortho Silicate)-$SiO_2$ film and a USG (Undoped Silicate Glass) film. The TEOS-$SiO_2$ film is an insulating film formed in the PECVD (Plasma Enhanced Chemical Vapor Deposition) process that uses a TEOS gas (which has been used in the conventional semiconductor device manufacture process) as a raw material. The USG film is formed by use of $SiH_4$ and $O_2$ gases.

Figure 2:
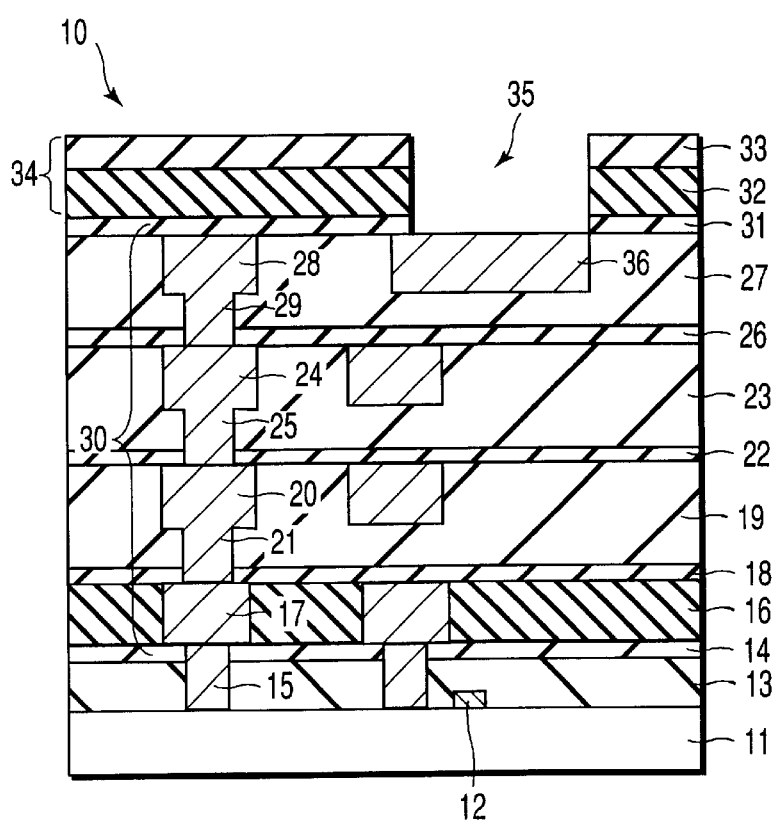
FIG. 2 is a sectional view of the semiconductor device, which is taken along line II—II in FIG. 1.

FIG. 1 is a plan view showing a semiconductor according to the first embodiment of the present invention. FIG. 2 is a sectional view of the semiconductor device, which is taken along line II—II in FIG. 1.

As shown in FIG. 1, a via ring 30 is formed along the periphery of a chip 10. The via ring 30 surrounds the device area of the chip 10.

As shown in FIG. 2, a gate electrode 12 is formed on a semiconductor substrate 11. A BPSG (Boron Phosphorous Silicate Glass) film 13 is formed in such a manner as to cover the gate electrode 12, and a TEOS-$SiO_2$ film 14 is formed on the BPSG film 13. A contact plug 15, which is made of W, is formed in the TEOS-$SiO_2$ film 14 and BPSG film 13. An SiON film 16, which has a thickness of 150 nm, for example, is formed on the TEOS-$SiO_2$ film 14. A first wiring layer 17, made of Cu or Al, is formed inside the SiON film 16. The first wiring layer 17 is connected to the contact plug 15.

The first wiring layer 17 and the SiON film 16 are overlaid with a diffusion preventing film 18 having a thickness of 70 nm, for example. This diffusion preventing film 18 is formed of any one of SiN, SiC, SiOC and SiCN. The diffusion preventing film 18 is overlaid with a first low dielectric constant film 19. A second wiring layer 20, made of Cu or Al, is formed inside the first low dielectric constant film 19, and is connected to the first wiring layer 17 through a first via 21. A diffusion preventing film 22 having a thickness of 70 nm, for example, and formed of any one of SiN, SiC, SiOC and SiCN is formed on both the second wiring layer 20 and the first low dielectric constant film 19. The diffusion preventing film 22 is overlaid with a second low dielectric constant film 23. A third wiring layer 24, made of Cu or Al, is formed inside the second low dielectric constant film 23, and is connected to the second wiring layer 20 through a second via 25. A diffusion preventing film 26 having a thickness of 70 nm, for example, and formed of any one of SiN, SiC, SiOC and SiCN is formed on both the third wiring layer 24 and the second low dielectric constant film 23. The diffusion preventing film 26 is overlaid with a third low dielectric constant film 27. A fourth wiring layer 28, made of Cu or Al, is formed inside the third low dielectric constant film 27, and is connected to the third wiring layer 24 through a third via 29. In this manner, the via ring 30 formed along the periphery of the chip 10 has a continuous groove defined by the vias 21, 25 and 29 and wiring layers 17, 20, 24, 28.

A diffusion preventing film 31 having a thickness of 70 nm, for example, and formed of any one of SiN, SiC, SiOC and SiCN is formed on both the fourth wiring layer 28 and the third low dielectric constant film 27. An SiON film 32 having a thickness of 150 nm, for example, is formed on the diffusion preventing film 31. The SiON film 32 is then overlaid with an SiN film 33 having a thickness of 400 nm, for example. The SiON film 32 and the SiN film 33 serve as a passivation film 34. The diffusion preventing film 31, the SiON film 32 and the SiN film 33 are selectively removed to form a pad window 35. The fourth wiring layer 28, the surface of which is exposed by the formation of the pad window 35, serves as a pad electrode 36.

In the multi-layered semiconductor device provided with low dielectric constant films 19, 23 and 27, the passivation film 34 is located in the uppermost layer of the chip 10, and the via ring 30 formed around the chip 10 and located in the neighborhood of the passivation film 34. In addition, the SiON film 16 adjacent to the via ring 30 is located between the first wiring layers 17. Furthermore, the passivation film 34 includes the SiON film 32.

Each of the SiON films 16 and 32 may be replaced with an SiN film or a laminated film made up of an SiON film and an SiN film. The SiON and the SiN films can be formed, for example, in the method described below.

The SiON film is formed in the PECVD process, using $(SiH_4+N_2O)$, $(SiH_4+N_2O+N_2)$, $(SiH_4+O_2+N_2)$ or $(SiH_4+O_2+NH_3)$ as a raw material gas. The SiON film can be formed, using another kind of raw material gas, as long as the raw material gas contains Si, O or N.

Likewise, the SiN film is formed in the PECVD process, using $(SiH_4+N_2)$ or $(SiH_4+NH_3)$ as a raw material gas. The SiN film can be formed, using another kind of raw material gas, as long as the raw material gas contains Si or N.

The SiON film and the SiN film may contain hydrogen components.

The SiON films 16 and 32 desirably have a thickness of not less than 100 nm, since the SiON films 16 and 32 having such thickness are effective in preventing moisture from entering the interior.

In many cases, the first wiring layer 17 is used as a local wiring layer (i.e., a wiring layer used for connection within a cell). Even if the region between the first wiring layers has only a high capacitance, this does not significantly affect the performance of the device. For this reason, a film having a remarkable water blocking effect, like an SiON film, can be provided in the region between the first wing layers.

The first embodiment described above employs a SiON film 32 of a passivation film 34 located in the uppermost layer of the chip 10, and a via ring 30 located on the side of the chip 10. In addition to these, the first embodiment employs an SiON film 16 in the region between the first wiring layers. With this structure, all routes through which moisture may enter the chip 10 can be blocked; in other words, moisture entry from above the chip, moisture entry from below the chip, and moisture entry from the side portions of the chip are prevented. Hence, the low dielectric constant films are protected from moisture, and their dielectric constants do not undesirably increase. Accordingly, the first embodiment can provide a semiconductor device that makes good use of the characteristics of the low dielectric constant films.

The SiON film and the SiN films 16 and 32 can be easily obtained since the materials of these films have been used in conventional semiconductor processes.

In the structure shown in FIG. 2, the pad window 35 may be filled with Al, thereby forming a pad. In this case as well, the adoption of the present invention is effective in preventing moisture from entering the interior of the chip 10.

[Second Embodiment]

The second embodiment is featured in that a high-level interlayer insulating film is made of a film with low water absorption and water permeability.

Figure 3:
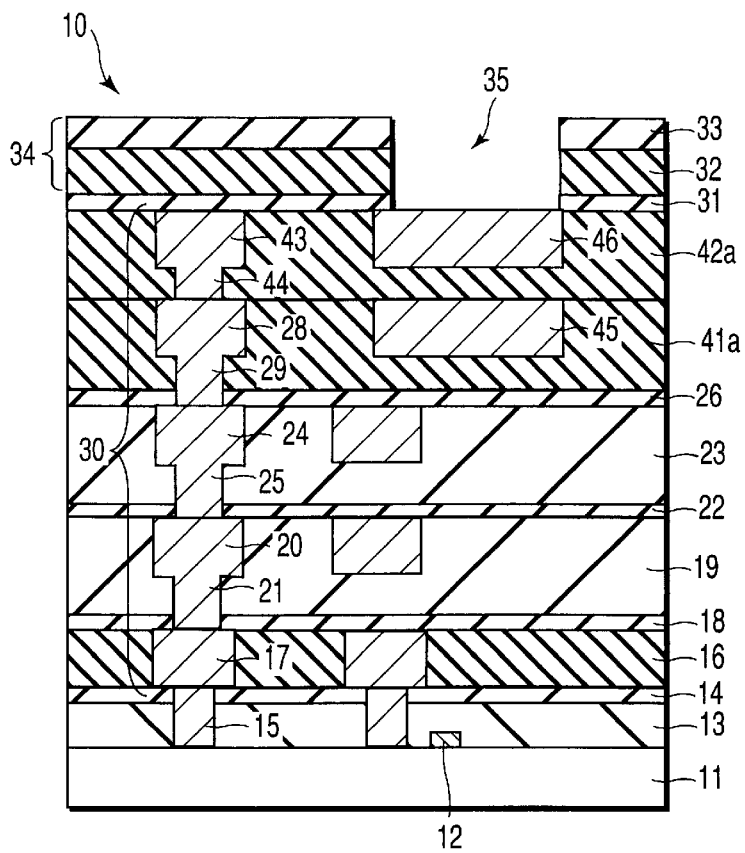
FIG. 3 illustrates the second embodiment of the present invention and is a sectional view showing a semiconductor device wherein an SiON film is used as an interlayer insulating film located at a high level.

FIG. 3 is a sectional view showing a semiconductor device according to the second embodiment of the present invention. As shown in FIG. 3, the semiconductor device of the second embodiment is similar to that of the first embodiment in that it comprises: a passivation film 34 formed in the uppermost layer of the chip 10; a via ring 30 formed along the periphery of the chip 10 and located close to the passivation film 34; and an SiON film 16 formed between the first wiring layers 17 and located adjacent to the via ring 30. In addition, the passivation film 34 is partly made of an SiON film 32.

The semiconductor device of the second embodiment differs from that of the first embodiment in light of the structure of high-level wiring layers. To be more specific, the upper two wiring layers 45 and 46 are used mainly as a power supply line and a grounding line. For this reason, the upper two interlayer insulating films 41a and 42a are not low dielectric constant films but films with low water absorption and water permeability. Specifically, they are films formed mainly of SiON, films formed mainly of SiN, or laminated films including these. In this manner, according to the second embodiment, the interlayer insulating films 19 and 23 made of a low dielectric constant film, are surrounded by the following: a passivation film 34; high-level interlayer insulating films 41a and 42a; a via ring 30 which is defined by continuous groove-like vias 21, 25, 29 and 44 and wiring layers 17, 20, 24, 28 and 43; and an interlayer insulating film 16 located between the first wiring layers 17.

With the second embodiment, it is possible to obtain advantages which are similar to those of the first embodiment.

Moreover, three films 41a, 42a and 32 with low water absorption and water permeability are formed above the low dielectric constant films 19 and 23. This structure is effective in preventing moisture from entering the interior of the chip 10 from above.

Figure 4:
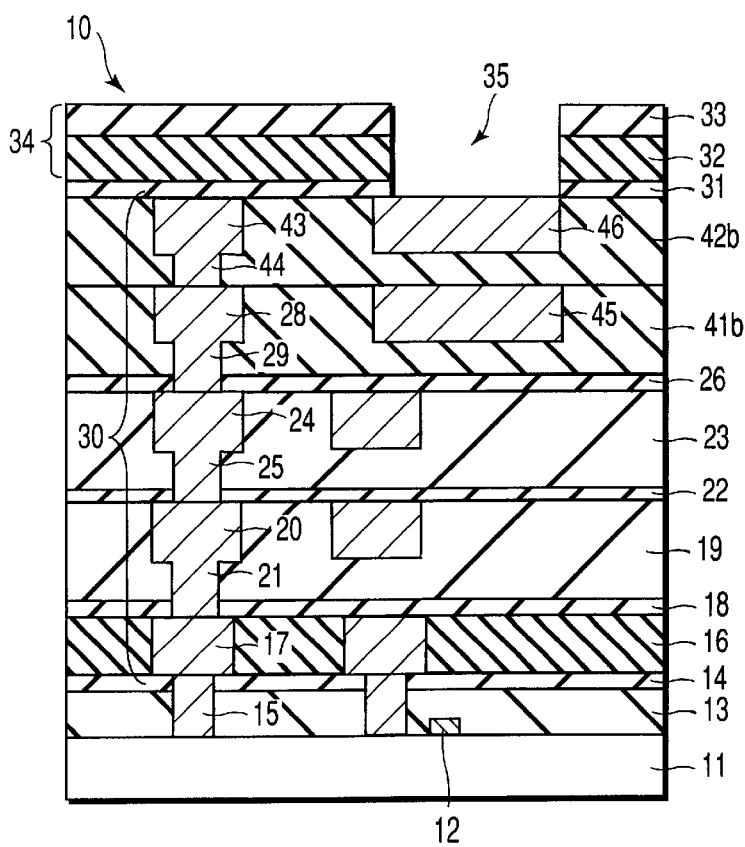
FIG. 4 illustrates the second embodiment of the present invention and is a sectional view showing a semiconductor device wherein a TEOS film is used as an interlayer insulating film located at a high level.

As shown in FIG. 4, the upper two interlayer insulating films 41b and 42b may be SiO films, such as TEOS films formed in the PECVD process or USG films.

[Third Embodiment]

The third embodiment is featured in that at least one of high-and low-level interlayer insulating films made of low dielectric constant films, is made of a film with low water absorption and water permeability.

Figure 5:
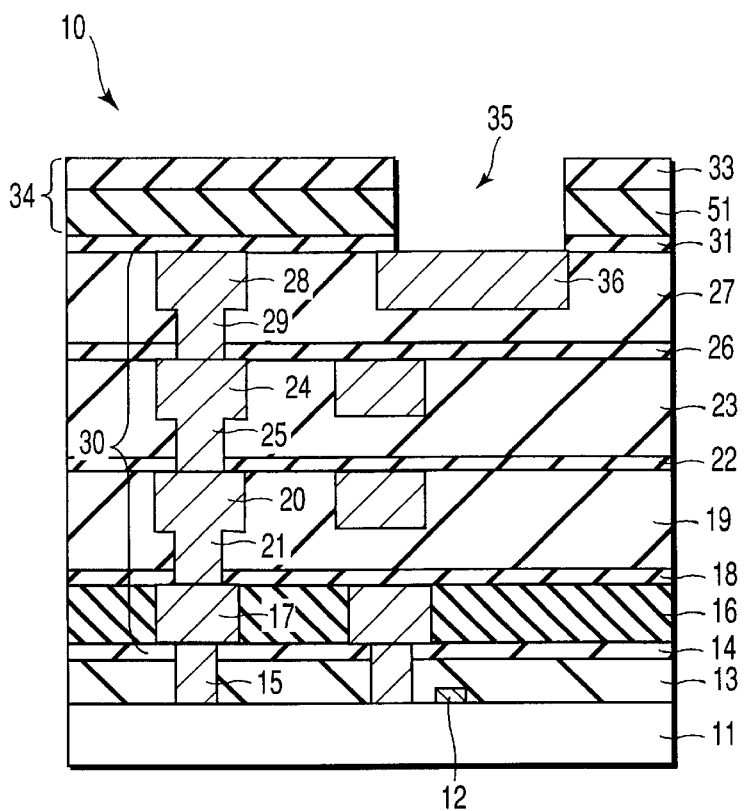
FIG. 5 illustrates the third embodiment of the present invention and is a sectional view showing a semiconductor device wherein an SiON film is used as a low dielectric constant film located at a low level.
Figure 6:
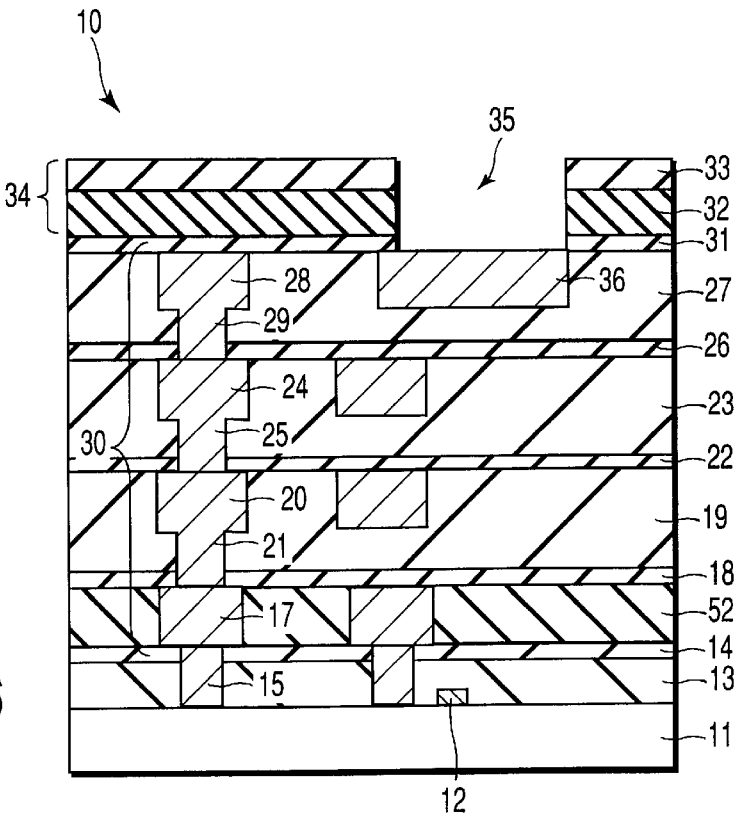
FIG. 6 illustrates the third embodiment of the present invention and is a sectional view showing a semiconductor device wherein an SiON film is used as a low dielectric constant film located at a high level.

FIGS. 5 and 6 are sectional views of a semiconductor device according to the third embodiment of the present invention. As shown in these Figures, the semiconductor device of the third embodiment is similar to that of the first embodiment in that it comprises: a passivation film 34 formed in the uppermost layer of the chip 10; and a via ring 30 formed along the periphery of the chip 10 and located close to the passivation film 34. The semiconductor device of the third embodiment differs from that of the first embodiment in that either the interlayer insulating film located between the first wiring layers 17 or part of the passivation film 34 is made of a film with low water absorption and water permeability. More specifically, either the interlayer insulating film or part of the passivation film is a film formed mainly of SiON, a film formed mainly of SiN, or a laminated film including these.

In the structure shown in FIG. 5, the interlayer insulating film located between the first wiring layers 17 is made of an SiON film 16, and part of the passivation film 34 is made of a TEOS film 51. On the other hand, in the structure shown in FIG. 6, the interlayer insulating film located between the first wiring layers 17 is made of a TEOS film 52, and part of the passivation film 34 is made of an SiON film 32.

The third embodiment described above employs a via ring 30 located on the side of the chip 10, and an SiON film 32 formed in the uppermost layer of the chip 10 (alternatively, an SiON film 16 located between the first wiring layers 17). With this structure, moisture entry from above the chip, moisture entry from below the chip, and moisture entry from the side portions of the chip are prevented. Hence, the low dielectric constant films are protected from moisture, and their dielectric constants do not undesirably increase. Accordingly, the third embodiment can provide a semiconductor device that makes good use of the characteristics of the low dielectric constant films.

Like the second embodiment, the third embodiment is applicable to the case where the upper two wiring layers 45 and 46 are used as a power supply line and a grounding line.

Figure 7:
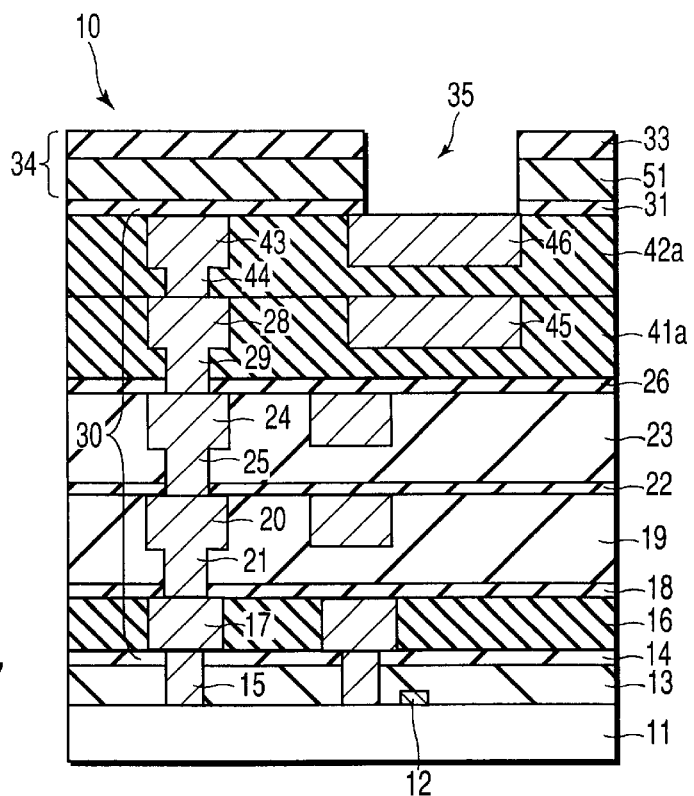
FIG. 7 is a sectional view showing a semiconductor device which has a structure similar to that shown in FIG. 5 and employs an SiON film as an interlayer insulating film located at a high level.
Figure 8:
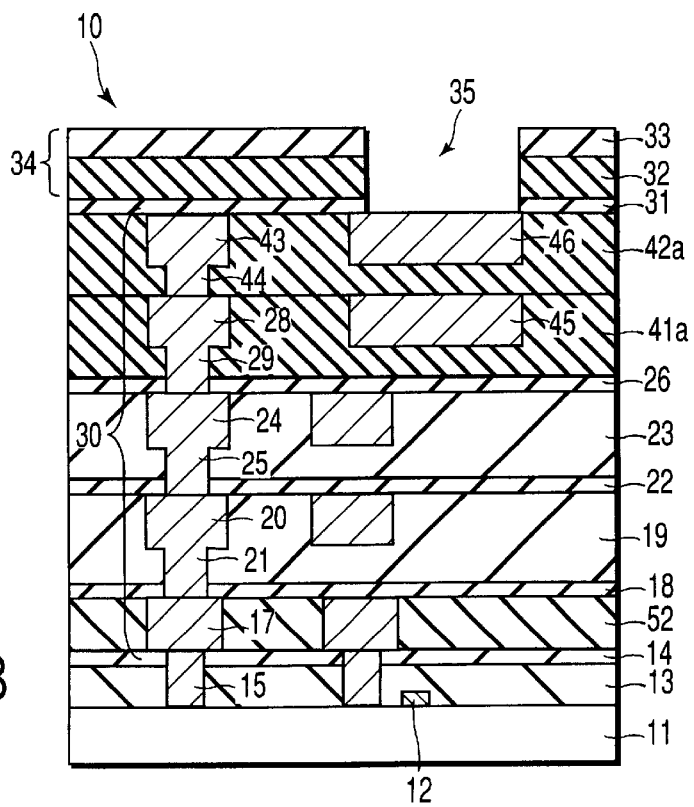
FIG. 8 is a sectional view showing a semiconductor device which has a structure similar to that shown in FIG. 6 and employs an SiON film as an interlayer insulating film located at a high level.

As shown in FIGS. 7 and 8, either the interlayer insulating film located between the first wiring layers 17 or part of the passivation film 34 may be made of a film with low water absorption and water permeability. More specifically, either the interlayer insulating film or part of the passivation film may be a film formed mainly of SiON, a film formed mainly of SiN, or a laminated film including these. In addition, the upper two interlayer insulating films 41a and 42a may be SiON films.

With this structure shown in FIG. 7, all routes through which moisture may enter the chip 10 can be blocked. That is, moisture entry from above the chip 10, moisture entry from below the chip 10, and moisture entry from the side portions of the chip 10 are prevented. The structure shown in FIG. 8 is particularly effective in preventing moisture from entering the chip 10 from above.

Figure 9:
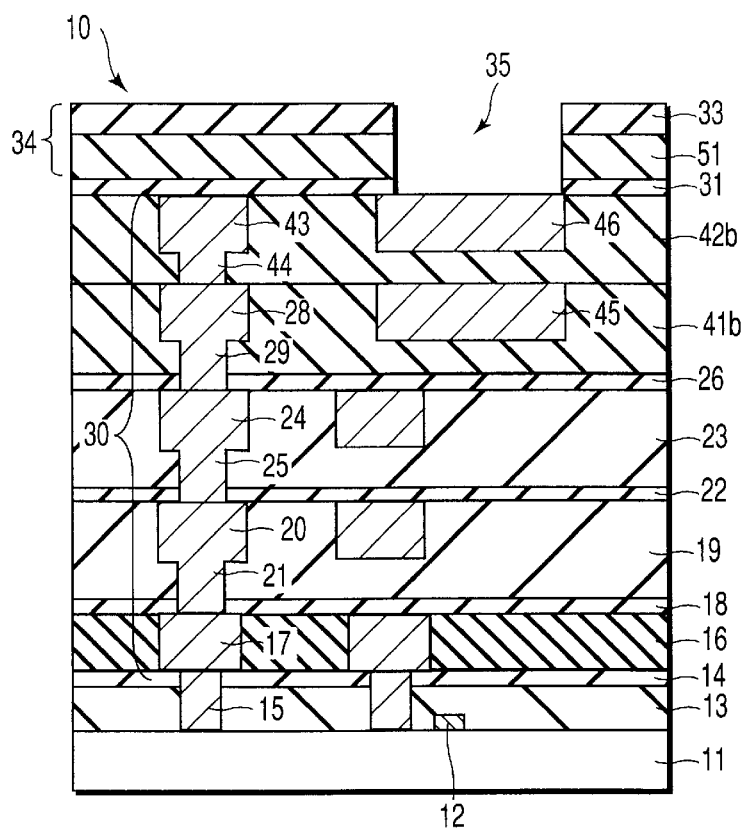
FIG. 9 is a sectional view showing a semiconductor device which has a structure similar to that shown in FIG. 5 and employs a TEOS film as an interlayer insulating film located at a high level.
Figure 10:
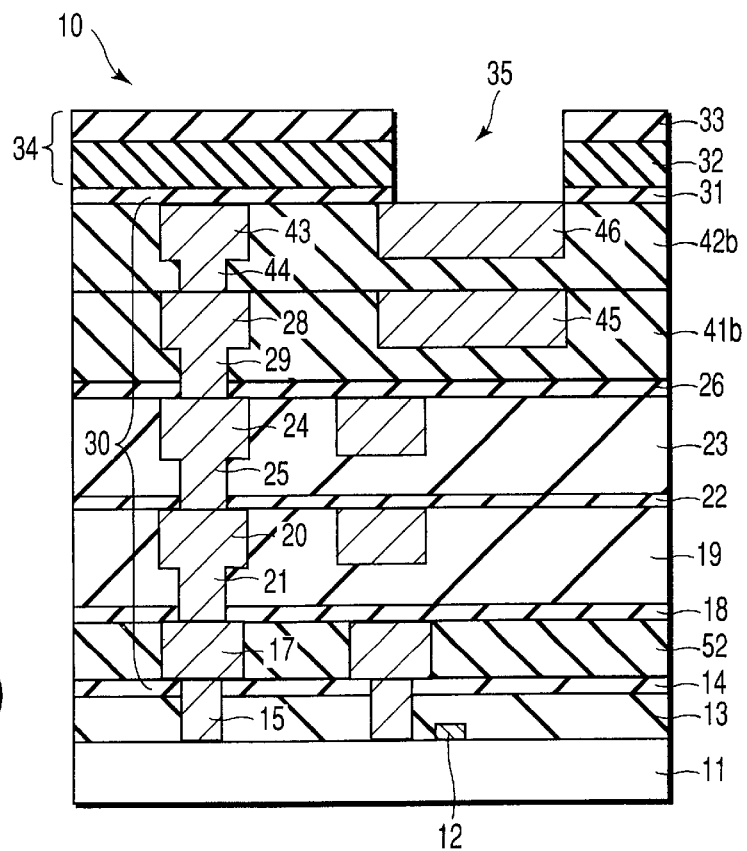
FIG. 10 is a sectional view showing a semiconductor device which has a structure similar to that shown in FIG. 6 and employs a TEOS film as an interlayer insulating film located at a high level.

As shown in FIGS. 9 and 10, either the interlayer insulating film located between the first wiring layers 17 or part of the passivation film 34 may be made of a film with low water absorption and water permeability. More specifically, either the interlayer insulating film or part of the passivation film may be a film formed mainly of SiON, a film formed mainly of SiN, or a laminated film including these. In addition, the upper two interlayer insulating films 41a and 42a may be SiO films, such as TEOS films formed in the PECVD process or USG films.

The structure shown in FIG. 9 employs three thick TEOS films 41b, 42b and 51, a via ring 30 and an SiON film 16. Hence, all routes through which moisture may enter the chip 10 can be blocked. That is, moisture entry from above the chip 10, moisture entry from below the chip 10, and moisture entry from the side portions of the chip 10 are prevented. On the other hand, the structure shown in FIG. 10 employs TEOS films 41b and 42b and an SiON film 32 which are located above the low dielectric constant films 19 and 23. This structure is particularly effective in preventing moisture from entering the chip 10 from above.

[Fourth Embodiment]

The fourth embodiment is featured in that a high-level interlayer insulating film made of a low dielectric constant film and the film lower in level than the lowermost wiring layer, are films with low water absorption and water permeability.

Figure 11:
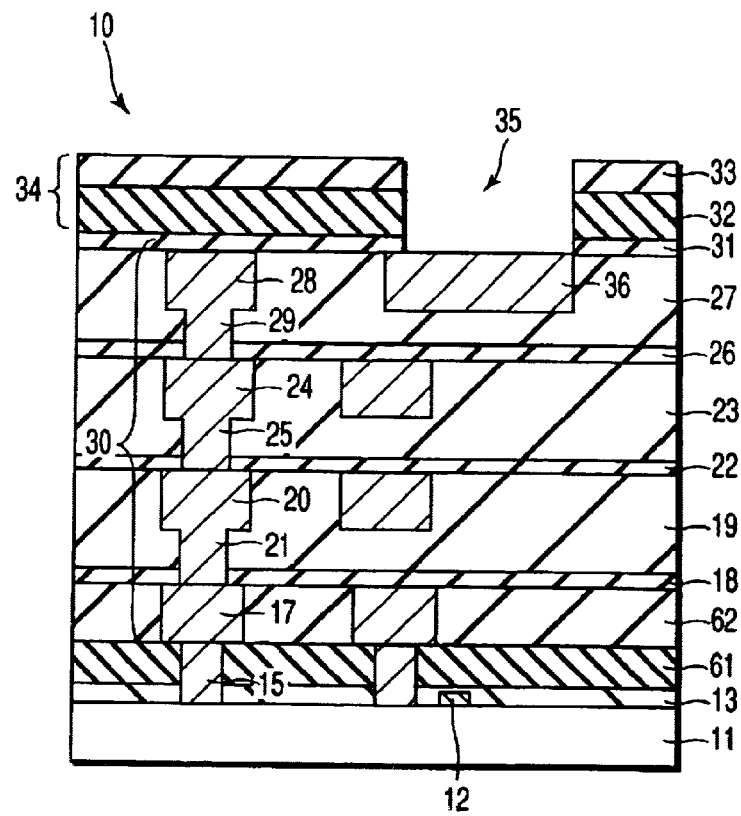
FIG. 11 is a sectional view showing a semiconductor device according to the fourth embodiment of the present invention.
Figure 12:
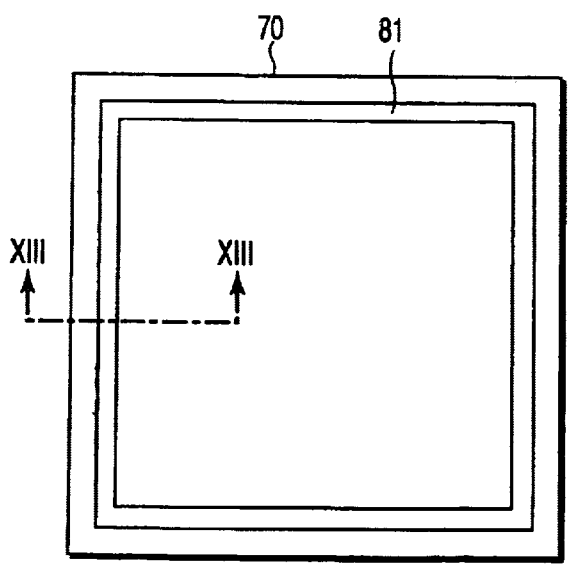
FIG. 12 is a plan view showing a semiconductor according to the first example of the prior art.
Figure 13:
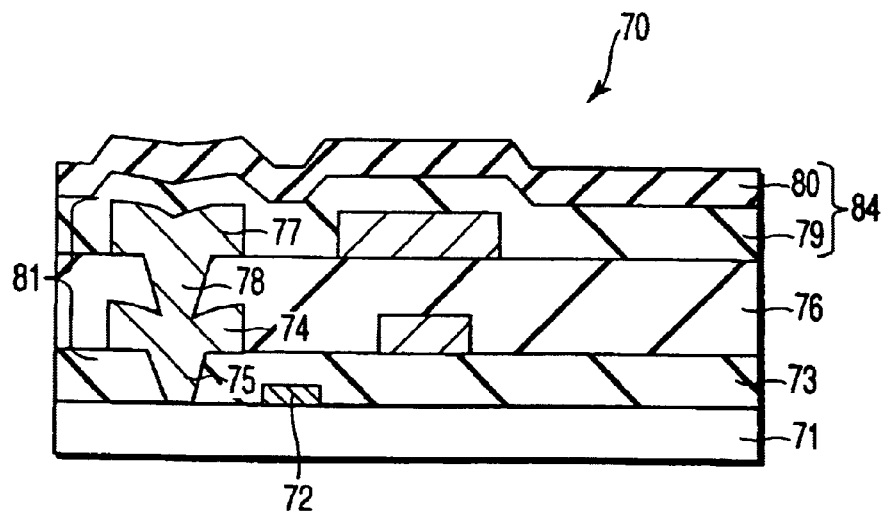
FIG. 13 is a sectional view of the semiconductor device, which is taken along line XIII—XIII in FIG. 12.
Figure 14:
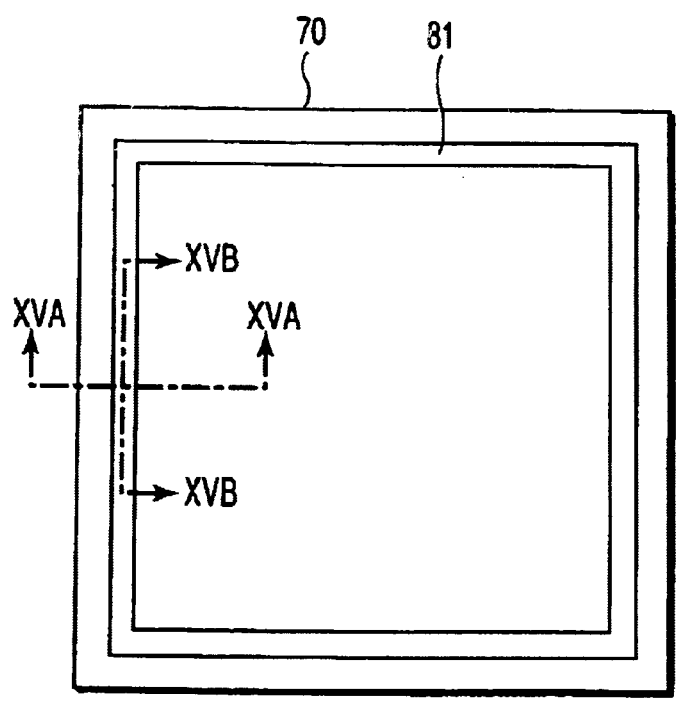
FIG. 14 is a plan view showing a semiconductor according to the second example of the prior art.
Figure 15A:
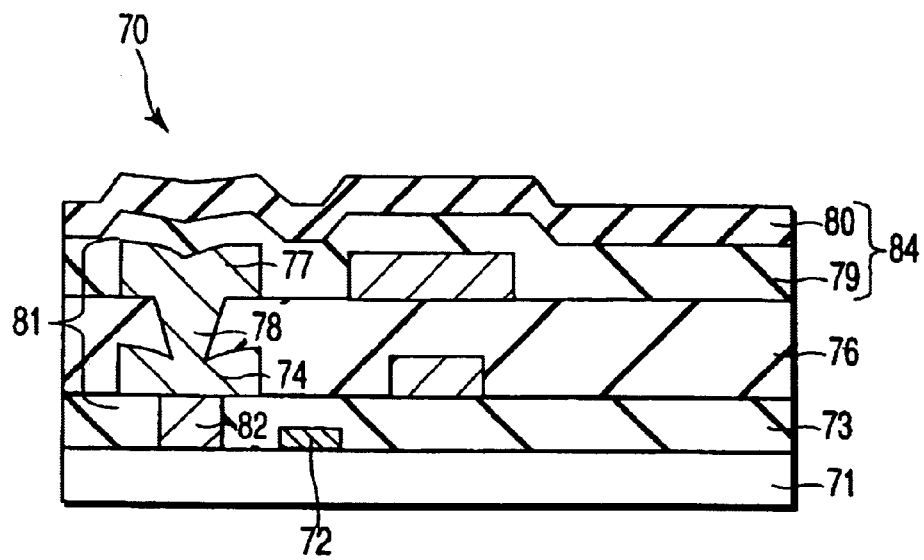
FIG. 15A is a sectional view of the semiconductor device, which is taken along line XVA—XVA in FIG. 14.
Figure 15B:
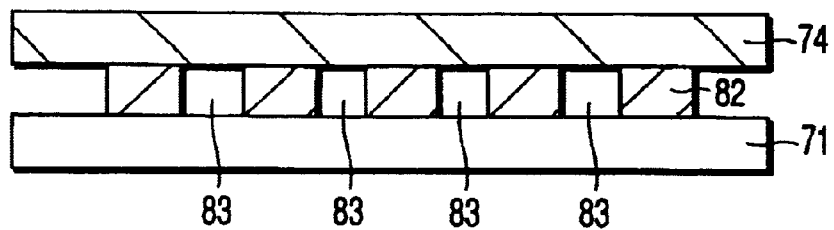
FIG. 15B is a sectional view of the semiconductor device, which is taken along line XVB—XVB in FIG. 14.

FIG. 11 is a sectional view of a semiconductor device according to the fourth embodiment of the present invention. As shown in FIG. 11, the semiconductor device of the fourth embodiment is similar to that of the first embodiment in that it comprises: a passivation film 34 formed in the uppermost layer of the chip 10; and a via ring 30 formed along the periphery of the chip 10 and located close to the passivation film 34. In addition, part of the passivation film 34 is made of an SiON film 32.

The semiconductor device of the fourth embodiment differs from that of the first embodiment in that the first wiring layer 17 is formed on an SiON film 61 having a thickness of 150 nm, for example. In other words, according to the fourth embodiment, the passivation film 34, the via ring 30 and the SiON film 61 (on which the first wiring layer 17 is formed) surround the interlayer insulating films 19, 23, 27 and 62 made of low dielectric constant films.

In the structure shown in FIG. 11, a BPSG film 13 is formed on the semiconductor substrate 11, and an SiON film 61 is formed on that BPSG film 13. However, this in no way restrict the present invention. For example, the SiON film 61 may be formed directly on the semiconductor substrate 11.

The low dielectric constant films 19 and 62 and the diffusion preventing film 18 may be replaced with a single-layer interlayer insulating film. In this case, the first wiring layer 17 is first formed, and the interlayer insulating film is formed on both the first wiring layer 17 and the SiON film 61. A second wiring layer 20 and a first via 21 of a damascene structure are formed inside the interlayer insulating film. The second wiring layer 20 is connected to the first wiring layer 17 through the first via 21.

With the fourth embodiment, it is possible to obtain advantages which are similar to those of the first embodiment.

The fourth embodiment described above can be combined with the first to third embodiments, if so desired.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a first insulating film;

a first wiring layer formed in the first insulating film;

a second insulating film formed above the first wiring layer and the first insulating film, the second insulating film including a low dielectric constant film whose specific dielectric constant is not more than 3;

a second wiring layer formed in the second insulating film, wherein a part of the second wiring layer is embedded in the low dielectric constant film, and coupled to the first wiring layer through a first connection section; and a third insulating film formed above the second wiring layer and the second insulating film and serving as one of an interlayer insulating film and a passivation film, the third insulating film covering the second wiring layer, and at least one of the first and third insulating films being one of: a film consisting essentially of SiON, a film consisting essentially of SiN, and a laminated film being the films consisting essentially of SiON or SiN, respectively.

2. A semiconductor device comprising:

a first insulating film;

a first wiring layer formed above the first insulating film;

a second insulating film formed above the first wiring layer and the first insulating film, the second insulating film including a low dielectric constant film whose specific dielectric constant is no more than 3;

a second wiring layer formed in the second insulating film, wherein a part of the second wiring layer is embedded in the low dielectric constant film, and coupled to the first wiring layer through a first connection section; and a third insulating film formed above the second wiring layer and the second insulating film and serving as one of an interlayer insulating film and a passivation film, the third insulating film covering the second wiring layer, and at least one of the first and third insulating films being one of: a film consisting essentially of SiON, a film consisting essentially of SiN, and a laminated film including the films consisting essentially of SiON or SiN, respectively.

3. A semiconductor device according to claim 1, further comprising:
  a fourth insulating film interposed between the second and third insulating films and serving as an interlayer insulating film; and
  a third wiring layer formed in the fourth insulating film and coupled to the second wiring layer through a second connection section, said fourth insulating film including one of a film consisting essentially of SiON, a film consisting essentially of SiN, and a film consisting essentially of SiO.

4. A semiconductor device according to claim 2, further comprising:
  a fourth insulating film interposed between the second and third insulating films and serving as an interlayer insulating film; and
  a third wiring layer formed in the fourth insulating film and coupled to the second wiring layer through a second connection section, said fourth insulating film including one of a film consisting essentially of SiON, a film consisting essentially of SiN, and a film consisting essentially of SiO.

5. A semiconductor device according to claim 1, wherein each of the film consisting essentially of SiON, the film consisting essentially of SiN, and the laminated film being the films consisting essentially of SiON or SiN respectively has a thickness of not less than 100 nm.

6. A semiconductor device according to claim 2, wherein each of the film consisting essentially of SiON, the film consisting essentially of SiN, and the laminated film being the films consisting essentially of SiON or SiN respectively has a thickness of not less than 100 nm.

7. A semiconductor device according to claim 3, wherein each of the film consisting essentially of SiON, the film consisting essentially of SiN, and the laminated film being the films consisting essentially of SiON or SiN respectively has a thickness of not less than 100 nm.

8. A semiconductor device according to claim 4, wherein each of the film consisting essentially of SiON, the film consisting essentially of Sin, and the laminated film being the films consisting essentially of SiON or SIN respectively has a thickness of not less than 100 nm.

9. A semiconductor device according to claim 1, wherein said first wiring layer is a local wiring layer.

10. A semiconductor device according to claim 2, wherein said first wiring layer is a local wiring layer.

11. A semiconductor device according to claim 3, wherein said third wiring layer is one of a power supply line and a grounding line.

12. A semiconductor device according to claim 4, wherein said third wiring layer is one of a power supply line and a grounding line.

13. A semiconductor device according to claim 1, wherein said first and second wiring layers and said first connection section form of a via-ring structure.

14. A semiconductor device according to claim 2, wherein said first and second wiring layers and said first connection section form of a via-ring structure.

15. A semiconductor device according to claim 13, wherein the first and second wiring layers, which are part of the via-ring structure, are located close or adjacent to the first and third insulating films, respectively.

16. A semiconductor device according to claim 14, wherein the first and second wiring layers, which are part of the via-ring structure, are located close or adjacent to the first and third insulating films, respectively.

17. A semiconductor device according to claim 3, wherein said first, second and third wiring layers and said first and second connection sections form of a via-ring structure.

18. A semiconductor device according to claim 4, wherein said first, second and third wiring layers and said first and second connection sections form of a via-ring structure.

19. A semiconductor device according to claim 17, wherein the first and third wiring layers, which are part of the via-ring structure, are located close or adjacent to the first and third insulating films, respectively.

20. A semiconductor device according to claim 18, wherein the first and third wiring layers, which are part of the via-ring structure, are located close or adjacent to the first and third insulating films, respectively.

* * * * *

UNITED STATES PATENT AND TRADEMARK OFFICE
CERTIFICATE OF CORRECTION

PATENT NO. : 6,670,710 B2  Page 1 of 1
DATED : December 30, 2003
INVENTOR(S) : Matsunaga It is certified that error appears in the above-identified patent and that said Letters Patent is hereby corrected as shown below:

<u>Column 9,</u>
Line 41, change "Sin" to -- SiN --.

<u>Column 10,</u>
Line 1, change "SIN" to -- SiN --.

Signed and Sealed this

Twenty-fourth Day of February, 2004

JON W. DUDAS
*Acting Director of the United States Patent and Trademark Office*